United States Patent
Hosomi (10) Patent No.: US 7,501,698 B2
(45) Date of Patent: Mar. 10, 2009

(54) METHOD AND SYSTEM FOR AN IMPROVED POWER DISTRIBUTION NETWORK FOR USE WITH A SEMICONDUCTOR DEVICE

(75) Inventor: Eiichi Hosomi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/973,373

(22) Filed: Oct. 26, 2004

(65) Prior Publication Data

US 2006/0087024 A1    Apr. 27, 2006

(51) Int. Cl.
*H01L 23/12* (2006.01)
(52) U.S. Cl. .................. 257/698; 257/700; 257/737; 257/438; 257/778; 257/E23.003; 438/106
(58) Field of Classification Search .............. 257/691, 257/698, 700, 737, 738, 778, E23.003; 438/106
See application file for complete search history.

(56) References Cited

U.S. PATENT DOCUMENTS

| | | | | |
|---|---|---|---|---|
| 6,225,702 B1 * | 5/2001 | Nakamura | .................. | 257/786 |
| 6,532,143 B2 * | 3/2003 | Figueroa et al. | .......... | 361/301.4 |
| 6,606,237 B1 * | 8/2003 | Naito et al. | .............. | 361/306.3 |
| 6,611,419 B1 * | 8/2003 | Chakravorty | ............. | 361/306.3 |
| 6,970,362 B1 * | 11/2005 | Chakravorty | ................ | 361/782 |

OTHER PUBLICATIONS

Hassen, A. et al., "Pentium 4 Processor Package Design and Development," Proceedings of Electronic Components and Technology Conference 2003, pp. 1431-1439, Jun. 2003.
Intel Pentium 4 Processor with 512-KB L2 Cache on 0.13 Micron Process and Intel Pentium 4 Processor Extreme Edition Supporting Hyper-Threading Technology datasheet, pp. 37-65, Nov. 2003.

* cited by examiner

*Primary Examiner*—A. Sefer
*Assistant Examiner*—Eduardo A Rodela
(74) *Attorney, Agent, or Firm*—Sprinkle IP Law Group (57) ABSTRACT

Systems and methods for a structure for a power distribution network intended to distribute power from a PCB to a semiconductor device on a package. These improved power distribution networks may reduce current crowding in the BGA balls of a package and may serve to more equitably distribute current through the BGA balls of the package through increasing the impedance of the package or decreasing the impedance of the PCB to which the package is coupled. These systems and methods may increase the impedance of the package through various arrangements of the coupling between BGA balls and planes of the package. By the same token, these systems and methods may decrease the impedance of the PCB coupled to the package by arrangement of the coupling between the PCB and the BGA balls of the package.

27 Claims, 9 Drawing Sheets

POWER

FIG. 8B

GROUND

*FIG. 10A*

POWER

*FIG. 10B*

GROUND

*FIG. 11A*

131  PTH  221 POWER PLANE

*FIG. 11B*

POWER SUPPLY

210

131

221 POWER PLANE

METHOD AND SYSTEM FOR AN IMPROVED POWER DISTRIBUTION NETWORK FOR USE WITH A SEMICONDUCTOR DEVICE

TECHNICAL FIELD OF THE INVENTION

The invention relates in general to methods and systems for power distribution in semiconductor devices and printed circuit boards, and more particularly, to power distribution networks with reduced current crowding.

BACKGROUND OF THE INVENTION

With the advent of the computer age, electronic systems have become a staple of modern life, and some may even deem them a necessity. Part and parcel with this spread of technology comes an ever greater drive for more functionality from these electronic systems. A microcosm of this quest for increased functionality is the size and capacity of various semiconductor devices. From the 8 bit microprocessor of the original Apple I, through the 16 bit processors of the original IBM PC AT, to the current day, the processing power of semiconductors has grown while the size of these semiconductors has consistently been reduce. In fact, Moore's law recites that the number of transistors on a given size piece of silicon will double every 18 months.

As semiconductors have evolved into these complex systems utilized in powerful computing architectures, almost universally, the connectivity and power requirements for these semiconductors have been increasing. In fact, the higher the clock frequency of the microprocessor, the greater that microprocessor's power consumption (all other aspects being equal).

Figures 1A, 1B:
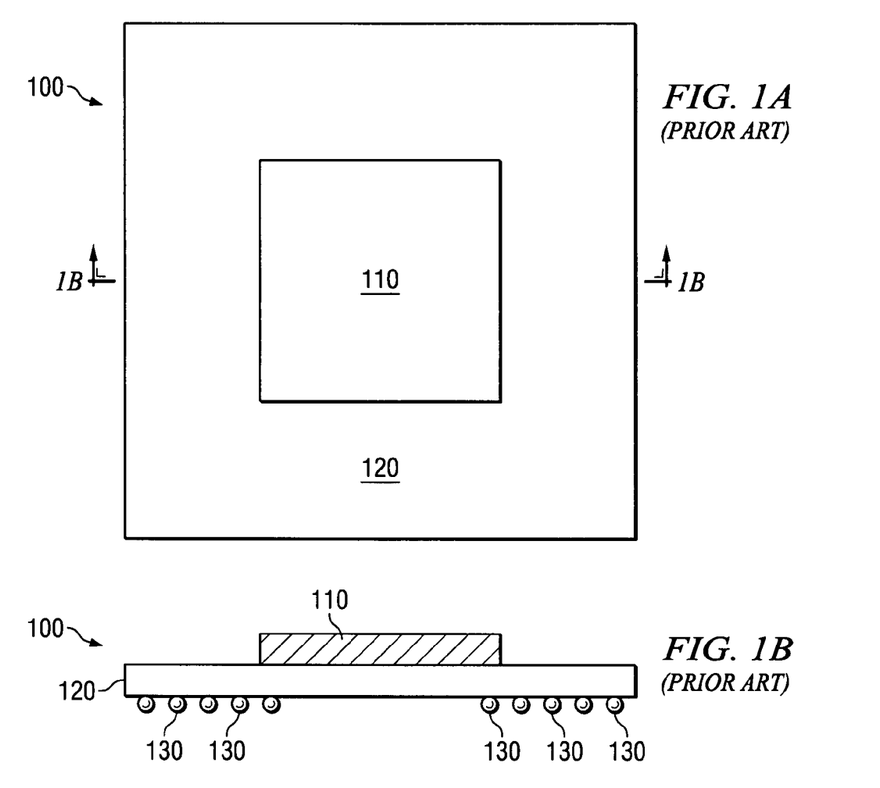
FIGS. 1A, 1B, and 1C depict an illustration of a semiconductor package.
Figure 1C:
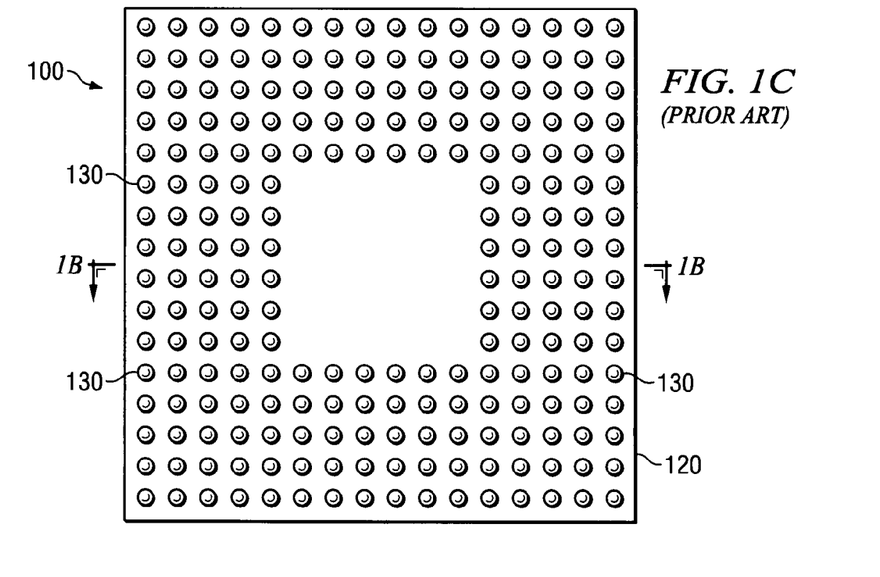

Turning briefly to FIGS. 1A, 1B, and 1C, one example of a semiconductor package 100 is depicted. Die 110 containing an integrated circuit, such as a microprocessor, is attached to substrate 120. Ball grid array (BGA) balls 130 serve to couple die 110 to a power source or signal input/output-lines. Typically substrate 120, with which microprocessors or semiconductors are packaged, is made of organic material (such as epoxy resin). Substrate 120 may be fabricated using build-up technology, which enables higher wiring capability by having fine-line build-up layer(s) on both sides of a coarser core substrate. Typically, these layers or planes of substrate 120 are coupled to BGA balls 130 through the use of vias.

These BGA balls 130 may then be coupled to a printed circuit board (PCB) which contains a power supply. In most cases, however, impedance of package 110 is smaller than the impedance of the PCB coupled to package 110. These dissimilar impedances may cause current to flow more easily in the power distribution network of package 110 than in PCB 220. This, in turn, may cause more current to flow through BGA balls 130 proximate to the power supply on the PCB.

Thus, a need exists for a power distribution network which reduces current crowding in the network and which effectuates a more equitable distribution of current.

SUMMARY OF THE INVENTION

Systems and methods for an improved structure for a power distribution network intended to distribute power from a PCB to a semiconductor device on a package are disclosed. These improved power distribution networks may reduce current crowding in the BGA balls of a package and may serve to more equitably distribute current through the BGA balls of the package. In order to achieve this, these systems and methods may endeavor to obtain an equalization of impedances between the package and the PCB to which the package is attached. Typically, this equalization is achieved by increasing the impedance of the package or decreasing the impedance of the PCB to which the package is coupled. These systems and methods may increase the impedance of the package through various arrangements of the coupling between BGA balls and planes of the package. Conversely, these systems and methods may decrease the impedance of the PCB coupled to the package by various arrangements of the coupling between the PCB and the BGA balls of the package.

In one embodiment, a semiconductor device package includes a set of ball grid array (BGA) balls and a set of planes, wherein at least one BGA ball from at least one row of BGA balls is coupled to at least one of the planes and a first plane is not coupled to a first BGA ball.

In some embodiments, the first BGA ball is proximate a power supply.

In other embodiments, the set of BGA balls comprises a set of rows and the first BGA ball is in a first row.

In yet other embodiments, the first plane is not coupled to the first row.

In still other embodiments, the first row is proximate the power supply and the first plane is distal from the BGA balls in the first row.

In another embodiment, the semiconductor package includes a second plane, wherein the second plane is not coupled to the first row.

In yet another embodiment, the semiconductor package includes a second row of BGA balls, wherein the first plane and the second plane are not coupled to the second row.

In still another embodiment, the second row is proximate the first row and the second plane is proximate the first plane.

In one more embodiment, the semiconductor package includes a third plane and a second BGA ball, proximate a die, wherein the third plane is not coupled to the second BGA ball.

In some other embodiments, the second BGA ball is in a third row of BGA balls and the third plane is not coupled to the third row.

In one embodiment, the semiconductor package includes a fourth plane, wherein the fourth plane is not coupled to the third row.

In another embodiment, a printed circuit board includes a set of attachment points, each attachment point operable to couple one of the set of BGA balls of a semiconductor package to the printed circuit board, including a first attachment point proximate a power supply, and a set of layers, wherein there is no direct physical connection between the layers and the first attachment point.

In other embodiments, the printed circuit board includes a first row of attachment points proximate the power supply, wherein the first attachment point is in the first row of attachment points.

In some embodiments, there is no direct physical connection between the first row of attachment points and the set of layers.

In one embodiment, a semiconductor package is manufactured, wherein this semiconductor package includes a set of ball grid array (BGA) balls and a set of planes, wherein a first plane is not coupled to a first BGA ball.

In still one more embodiment, a printed circuit board is manufactured, including a set of attachment points, each attachment point operable to couple one of the set of BGA balls of a semiconductor package to the printed circuit board, including a first attachment point proximate a power supply, and a set of layers, wherein there is no direct physical connection between the layers and the first attachment point.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Reference is now made in detail to the exemplary embodiments of the invention, examples of which are illustrated in the accompanying drawings. Wherever possible, the same reference numbers will be used throughout the drawings to refer to the same or like parts (elements).

A few terms are defined or clarified to aid in an understanding of the terms as used throughout the specification. The term "attach" is intended to mean a physical, electrical or any other type of coupling or any combination of these various types of couplings, while the term "coupled" is intended to mean any type of connection, either direct, indirect, physical, electrical, etc.

The term "row" is intended to mean a group of, usually lined up on at least one axis. For example, if a set of BGA balls are in a row, they will usually be aligned on at least one axis.

The term "set", when used in the mathematical sense as in "a set of" is intended to mean a collection of zero or more elements.

The term "power balls" is intended to mean balls in a BGA attached to one or more power planes.

The term "ground balls" is intended to mean balls in a BGA attached to one or more ground planes.

The term "power distribution network" is intended to mean the structure for supplying power from a power supply to a die, including any subset or portion of this structure. For example, power supplies, planes in a PCB, PTHs in a PCB, attachment points for balls of a BGA on a PCB, balls of a BGA, vias attached to balls within a BGA or between planes of a package, a BGA, planes of a package substrate attached to vias, etc.

Before turning to embodiments of the present invention, a general hardware description which may be utilized in explaining these various embodiments will be described. To begin with, a typical arrangement of the coupling of a substrate to the balls of a ball grid array is depicted more clearly in FIG. 2. BGA balls 130 are coupled to vias 132, which are in turn coupled to planes 11-14, 21-23 of substrate 120. It will be understood by those of ordinary skill in the art that certain balls 130 may be coupled to power planes 11-14 and other balls 130 may be coupled to ground planes 21-23. In many cases, balls coupled to power planes 11-14 and ground planes 21-23 will alternate in the same row 61-67 of BGA balls 130.

Figure 2:
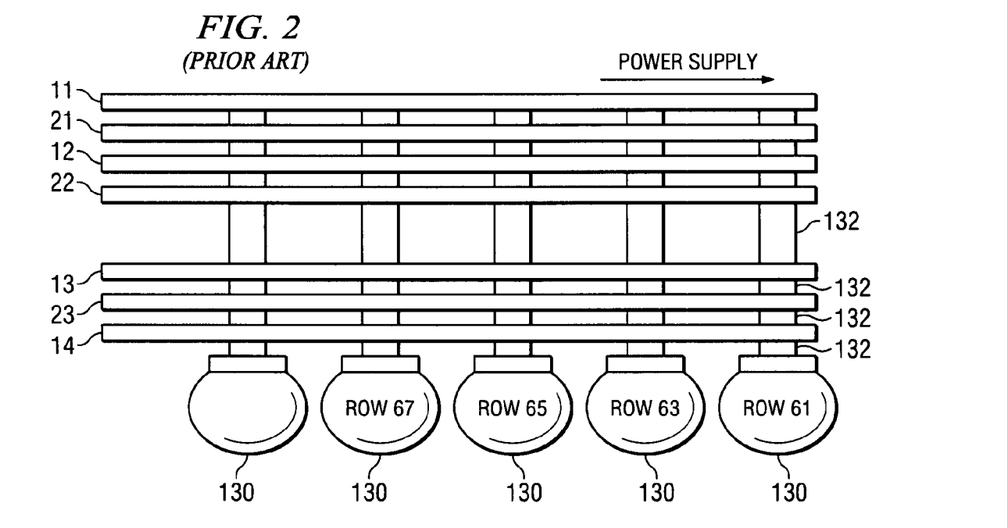
FIG. 2 depicts a cross-sectional view of the planes and BGA balls of a semiconductor package.

As the connectivity and power requirements of a semiconductor on die 110 increases, there is usually a need for a greater number of signal and power pins, which are connected through BGA balls 130. This usually results in a larger package 100 size. One possible way of reducing the size of package 100 is to attach pins of die 110 used for routing the signals needed by die 110 to BGA balls 130 around all four sides of package 100 surrounding die 110. This methodology, however, degrades the power distribution network of package 110 and the printed circuit board (PCB) to which package 110 usually attaches, as BGA balls 130 used for the power distribution network must be interspersed with BGA balls 130 used for signal input/output lines.

Figure 3:
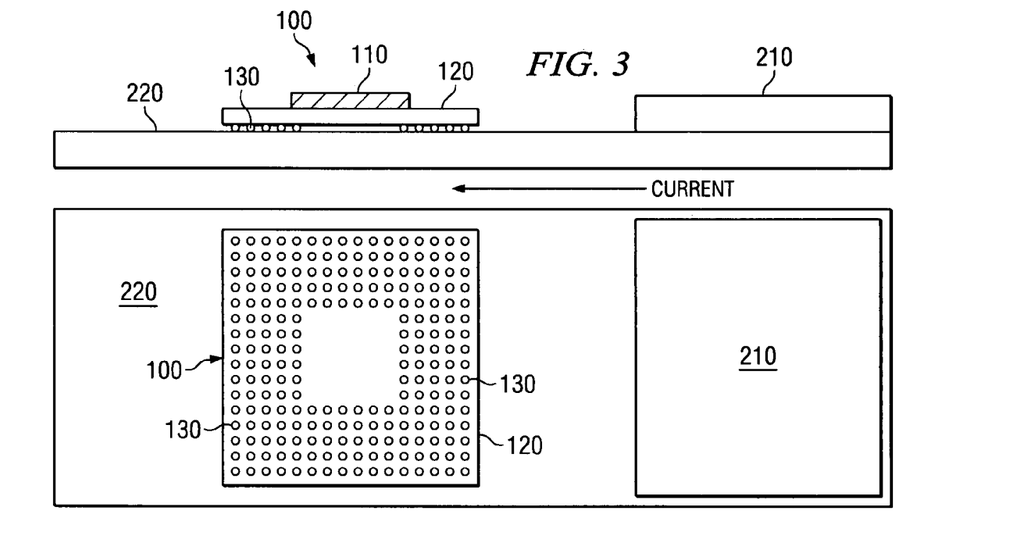
FIG. 3 depicts an illustration of a semiconductor package coupled to a printed circuit board containing a power supply.

Therefore, it may desirable to utilize one side of package 110 for a power distribution network. BGA balls 130 on one side of package 110 may be open for a power distribution network, and the main power supply on the PCB to which package 110 attaches may be located close to the side of package 110 open for a power distribution network. FIG. 3 depicts this methodology in more detail. Power supply 210 is coupled to PCB 220 in close proximity to side of package 100 open for power distribution network. Current flows from power supply 210, through layers of PCB 220, to area of PCB 220 where balls of BGA 130 are coupled, through vias 132 attached to BGA balls 130 to planes 11-14, 21-23 of substrate and eventually to die 110.

Package 110, and PCB 200 to which package 110 is coupled, may be composed of build-up layers, where one side of package 110 is utilized for a power distribution network. These layers may consist of planes 11-14, 20-23 in package 110 and layers comprising PCB 220 to which package 110 is attached. Power supply module 210 may supply current to die 110 in center of package 100. This current may pass from PCB 220 through plate through holes (PTHs) in the layers of PCB 220 to BGA balls 130 of package 110; current can then flow from BGA balls 130 to die 110 through planes 11-14, 20-23 of package 110 attached to vias 132 of BGA balls 130.

Typically, however, impedance of package 110 is smaller than the impedance of PCB 220 coupled to package 110. These dissimilar impedances may cause current to flow more easily in the power distribution network of package 110 than in PCB 220. This, in turn, may cause more current to flow through BGA balls 130 proximate to power supply 210.

Figure 4:
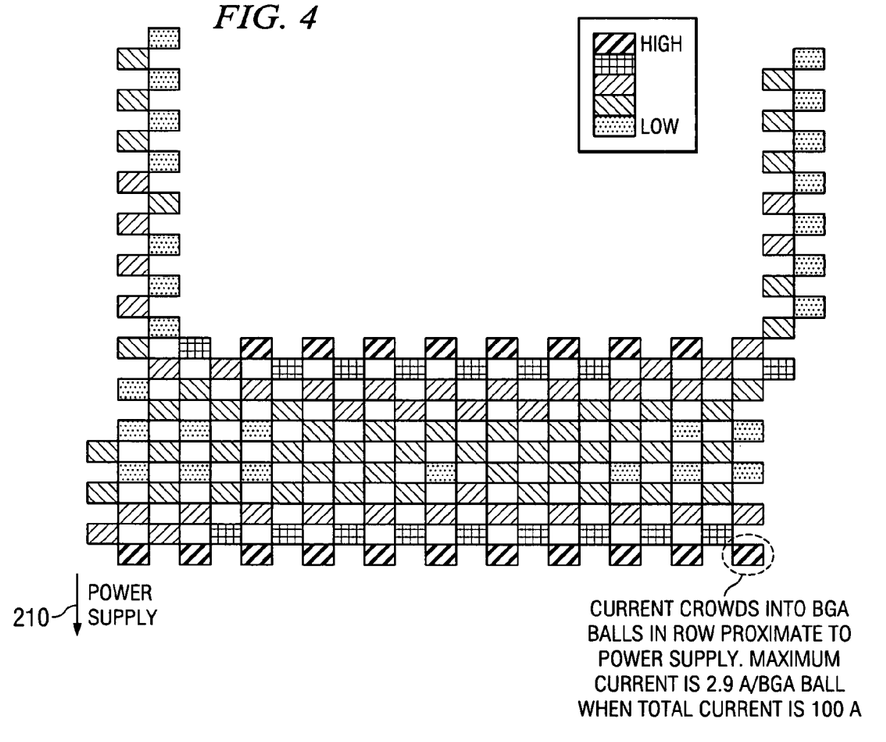
FIG. 4 depicts a representation of the current flowing through the BGA balls of a semiconductor package constructed similarly to the one depicted in FIG. 2.

FIG. 4 illustrates this current crowding in more detail. In FIG. 4 the current flowing through each BGA ball 130 in the power distribution network of package 110 is depicted. As can be seen current crowds into row of BGA balls 130 proximate to power supply 210, with the maximum current flowing through any one BGA ball 130 being 2.9 amperes. This current crowding not only effects the amount of current flowing through other BGA balls 130 in package 110, but the buildup of a large current flow in a particular set of balls 130 may decrease the long term reliability of these BGA balls 130 and their associated vias 132. What is needed is a power distribution network which reduces this current crowding and improves current distribution throughout the network.

Attention is now directed to systems and methods for a structure for a power distribution network intended to distribute power from a PCB to a semiconductor device on a package. These improved power distribution networks may reduce current crowding in the BGA balls of a package and may serve to more equitably distribute current through the BGA balls of the package. In order to achieve this, these systems and methods may endeavor to obtain an equalization of impedances between the package and the PCB to which the package is attached. Typically, this equalization is achieved by increasing the impedance of the package or decreasing the impedance of the PCB to which the package is coupled. These systems and methods may increase the impedance of the package through various arrangements of the coupling between vias of BGA ball s and planes of the package. By the same token, these systems and methods may decrease the impedance of the PCB coupled to the package by arrangement of the coupling between the PCB and the BGA balls of the package.

Figure 5:
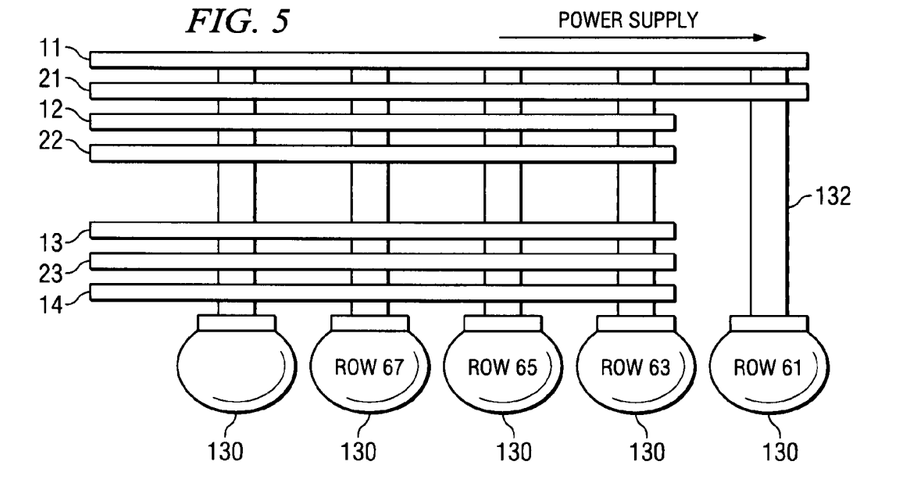
FIG. 5 depicts one embodiment of a structure for a power distribution network in accordance with the systems and methods of the present invention.

Turning now to FIG. 5, one instance-of a power distribution network for a package which alleviates current crowding and achieves a more equitable distribution of current within the package are depicted. As explained above, and as shown in FIG. 2 package 110 may contain layers. Layers in turn may be arranged as planes 11-14 and 21-23, and in one embodiment planes 11-14 may be for power while planes 21-23 may be for ground, as is known in the art. BGA balls 130 can be coupled to planes 11-14 and 21-23 through vias 132. Current flows from PCB 220 to BGA balls 130 coupled to power planes 11-14, through vias 132, onto power planes 11-14 to die 110 and from die 110 to ground planes 21-23 through vias 132 to BGA balls coupled to ground planes 21-23. Certain BGA balls 130 may be power balls and coupled only to power planes 11-14, while other BGA balls may be ground balls and coupled only to ground planes 21-23. These power balls and ground balls may alternate within a given row 61-67 of BGA balls 130.

As noted above, current tends to crowd in row 61 of BGA balls 130 at the edge of package 100 proximate to power supply 210. However, it is not necessary that all the power planes 11-14 be attached to all power balls in the BGA or that all the ground planes 21-23 of package 100 be attached to every ground ball within the BGA. In fact, having every power plane 11-14 attached to every power ball and every ground plane 21-23 attached to every ground ball provides a uniform path of low resistance to current flowing from BGA ball 130 to die 110.

To decrease the current crowding in row 61 of BGA balls 130 at the edge of package 100 proximate power supply 210, impedance of package 100 may be raised. In one embodiment, this may be accomplished by coupling one or more of the BGA balls of the row of BGA balls proximate the power supply only to the power and ground planes distal from the BGA balls of the row.

FIG. 5 depicts one embodiment of such a structure for connecting planes within package 100 to BGA balls 130. As can be seen in FIG. 5, in row 61, proximate power supply 210, only power plane 11 distal from BGA balls 130 is coupled to vias 132 of power balls in row 61. Similarly, only ground plane 21 distal from BGA balls 130 and proximate power plane 11 is coupled to vias 132 of ground balls in row 61. Planes 12-14, 22 and 23 may be coupled to the remainder of the power and ground balls respectively in power distribution BGA. Consequently, BGA balls 130 in row 61 proximate power supply 210 in FIG. 5 present a higher impedance than BGA balls 130 in row 61 of FIG. 2, which are coupled to all power 11-14 and ground 21-23 planes. Therefore, a semiconductor package formed using the structure depicted in FIG. 5 will present a higher impedance than a semiconductor package formed according to the structure depicted in FIG. 2.

It will be understood that this same methodology may be applied to any single BGA ball 130 proximate power supply 210 by coupling only plane 11 (if BGA ball 130 is a power ball) or plane 21 (if BGA ball 130 is a ground ball) to an individual BGA ball 130 proximate power supply 210. This, in turn, will cause less crowding of current in BGA balls 130 proximate power supply 210.

Figure 6:
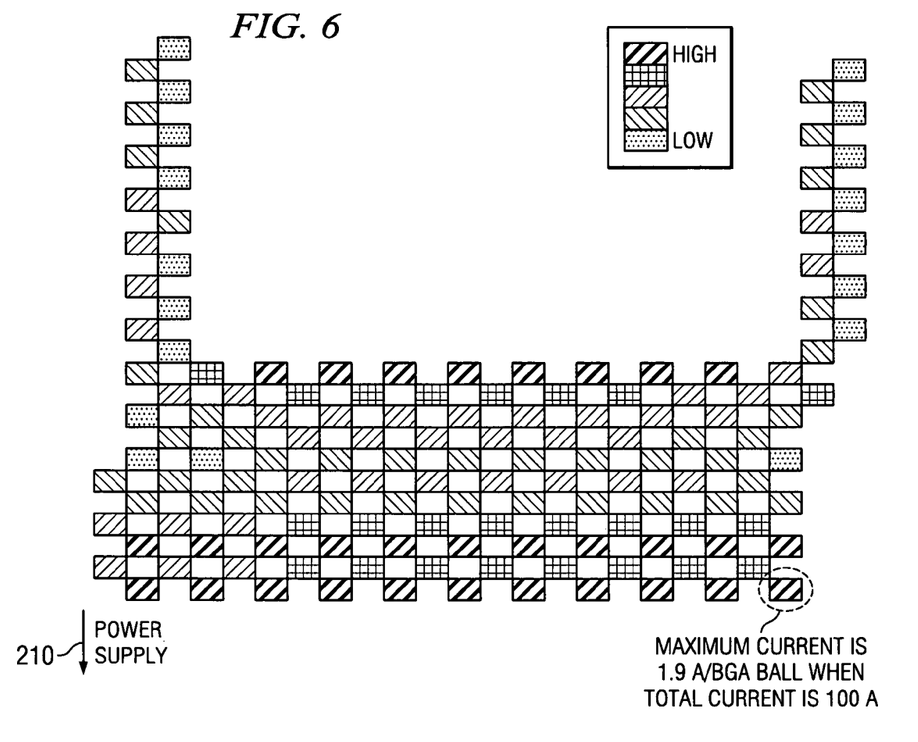
FIG. 6 depicts a representation of the current flowing through the BGA balls of a semiconductor package constructed similarly to the one depicted in FIG. 5.

This improvement in current crowding may be empirically observed. FIG. 6 shows a simulation result using the structure depicted in FIG. 5 for connecting BGA balls 130 to planes 11-14, 21-23 of package 100. Again, assuming a 100 ampere power supply, it can be seen that the magnitude of current crowded into the row of BGA balls 130 nearest power supply 210 has been greatly reduced. More specifically, the maximum current in any one BGA ball 130 using the structure depicted in FIG. 5 has been reduced to 1.9 Amperes.

It will be understood by those of ordinary skill in the art after reading this disclosure, that BGA balls 130 and planes 11-14, 21-23 of package 100 may be coupled in a variety of arrangements, that as long as at least one plane 11-14, 21-23 of the planes in package lob is not connected to at least one ball 130 in BGA improved power distribution characteristics may be obtained, and that the permutation or arrangement desired may be determined by any sort of empirical or theoretical means.

Figure 7:
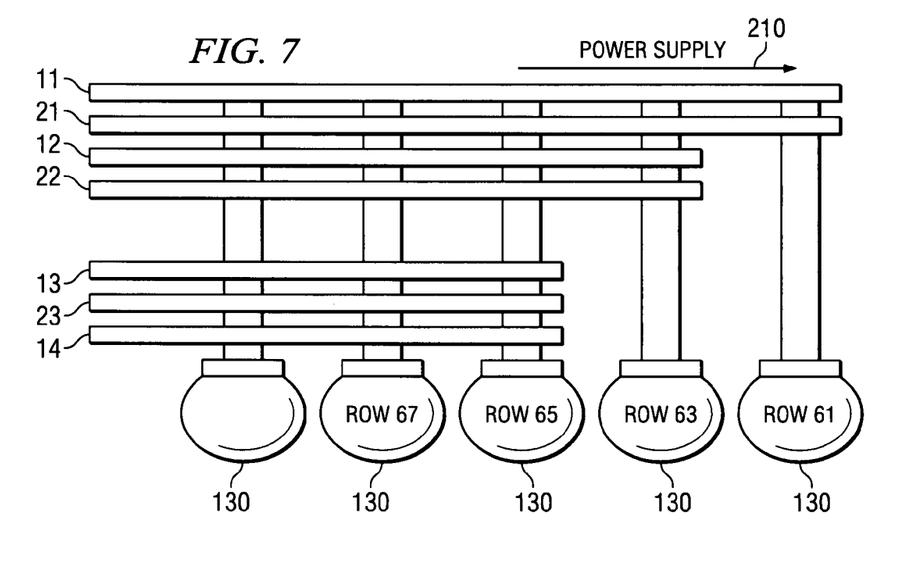
FIG. 7 depicts one embodiment of a structure for a power distribution network in accordance with the systems and methods of the present invention.

For example, FIG. 7 depicts another embodiment of a structure for a power distribution network which exhibits improved power distribution characteristics. In this case, BGA balls 130 in the two rows 61, 63 of BGA balls proximate power supply 210 may only be connected to a limited number of planes 11-14, 21-23. In one particular embodiment, power balls and ground balls in first row 61 of BGA balls 130 proximate power supply 210 are coupled only to power plane 11 and ground plane 21 similarly to the structure in FIG. 5.

However, while BGA balls 130 in second row 63 of the structure depicted in FIG. 5 are coupled to all power planes 11-14 or all ground planes 21-23 of package 100; BGA balls 130 in second row 63 of the structure depicted in FIG. 7 are coupled only to power planes 11 and 12 or ground planes 21 and 22 of package 100. The remainder of BGA balls 130 in the power distribution network of package 100 may be coupled to either all power planes 11-14 or all ground planes 21-23 of package 100. Consequently, BGA balls 130 in row 63 proximate row 61 in FIG. 7 present a higher impedance than BGA balls 130 in row 63 of FIG. 5, which are coupled to all power 11-14 and ground 21-23 planes. Therefore, a semiconductor package formed using the structure depicted in FIG. 7 will present a higher impedance than a semiconductor package formed according to the structure depicted in FIG. 5.

Figure 8A:
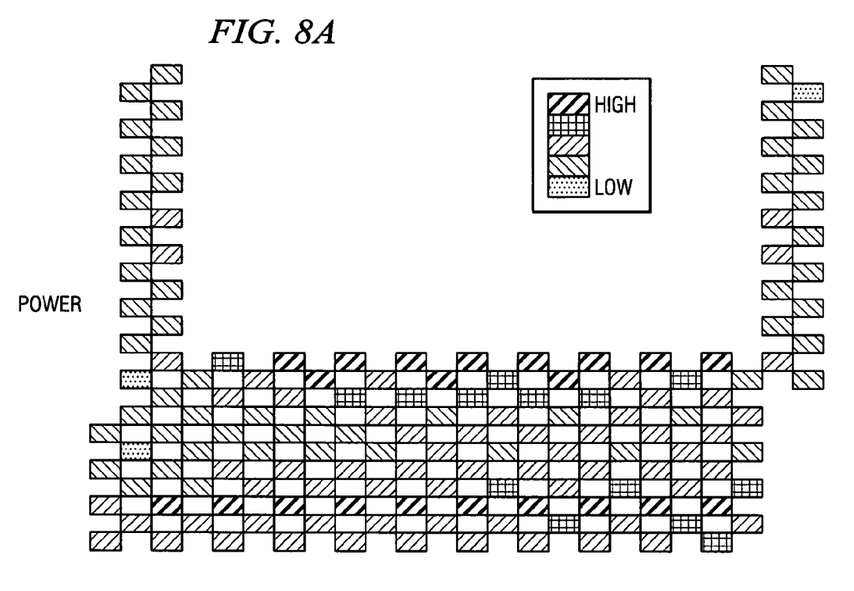
FIGS. 8A and 8B depict a representation of the current flowing through the BGA balls of a semiconductor package constructed similarly to the one depicted in FIG. 7.
Figure 8B:
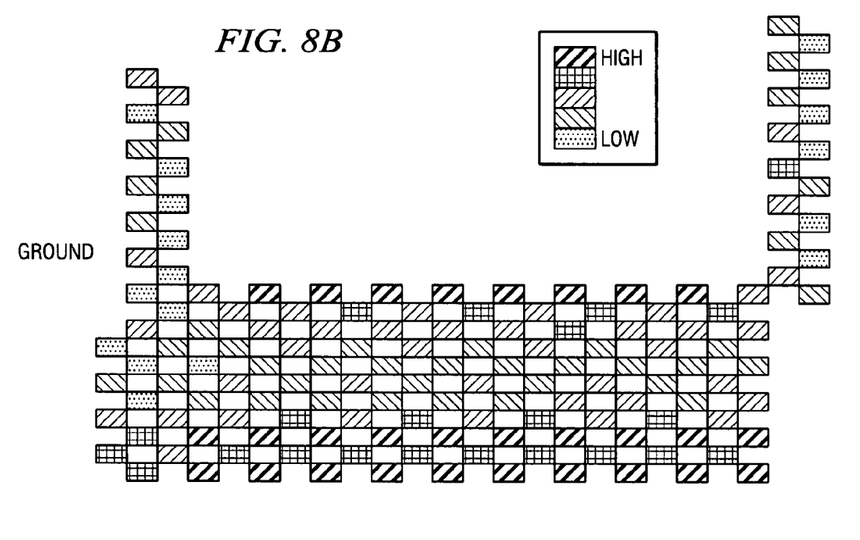

As can be imagined from the previous discussion, the power distribution network depicted in FIG. 7 exhibits improved power distribution characteristics, including reduced current crowding in BGA balls 130 proximate power supply 210. These advantageous power distribution characteristics are depicted in FIGS. 8A and 8B. FIGS. 8A and 8B depict the current flowing through BGA balls 130 in a power distribution network like that depicted in FIG. 7 taken from the vantage point of a ground plane 21-23 of package 100 and a power plane 11-14 of package 100. Once again, supposing a 100 ampere power supply, note the reduced current crowding, and that the maximum current flowing through any one ball 130 of BGA in the power plane is 1.7A, while the maximum current flowing through any one ball 130 of BGA in the ground plane is 1.7A.

As explained above, a variety of configurations may be used when attaching planes 11-14, 21-23 of package 100 to vias 132 of BGA balls 130. Some of these configurations may couple certain BGA balls 130 to particular planes 11-14, 21-23 of package 100 and other BGA balls 130 to other planes 11-14, 21-23 in package 100. Other of these configurations may couple certain rows of BGA balls 130 to one set of planes 11-14, 21-23 in package 100 and other rows of BGA balls 130 to another set of planes 11-14, 21-23. Along the same lines, certain rows of BGA balls 130 may only be coupled to certain planes 11-14, 21-23 within a set of planes 11-14, 21-23 while other rows of BGA balls 130 may only be coupled to certain planes 11-14, 21-23 within another set of planes 11-14, 21-23.

Figure 9A:
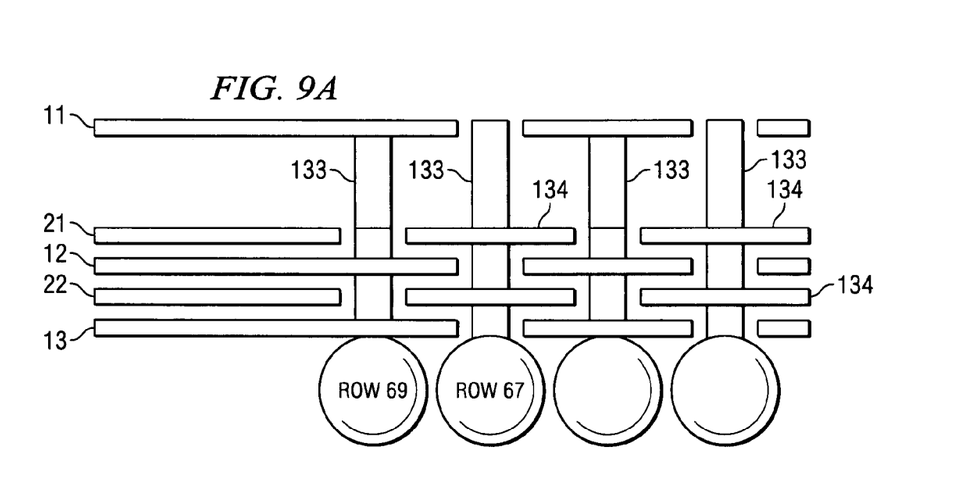
FIG. 9A depicts a representation of an embodiment of a structure for a power distribution network in accordance with the systems and methods of the present invention.
Figure 9B:
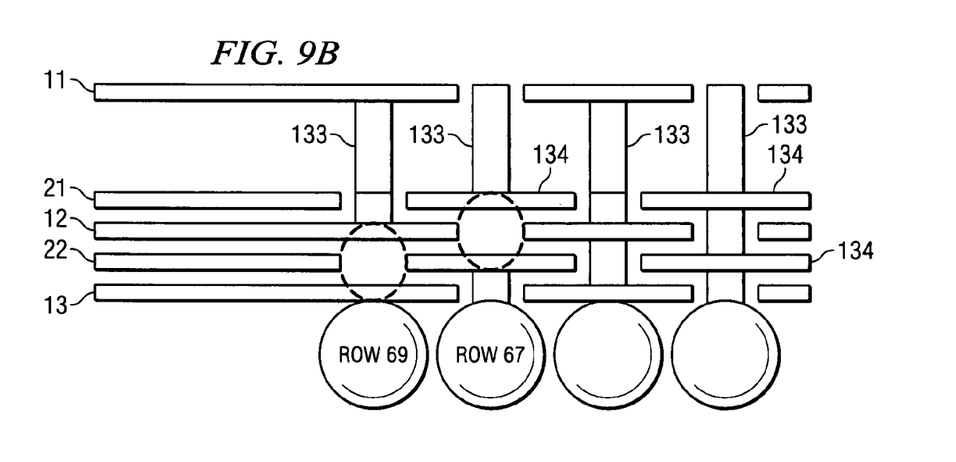
FIG. 9B depicts a representation of an embodiment of a structure for a power distribution network in accordance with the systems and methods of the present invention.

FIGS. 9A and 9B illustrate another embodiment of a power distribution network structured in accordance with the systems and methods of the present invention. In FIG. 9A a cross section of a structure for a power distribution network is presented. Power balls within row 67 may be coupled to power planes 21, 22, while ground balls within row 69 may be coupled to ground planes 11-13. FIG. 9B depicts an embodiment of a structure for a power distribution network which may have even more desirable power distribution characteristics, and which may be obtained by altering the structure depicted in FIG. 9A. By deleting portions of certain vias 132 within the power distribution network depicted in FIG. 9A, certain BGA balls 130 may only be coupled to certain planes 11-14, 21-23 within a particular set of planes 11-14, 21-23 while other BGA balls 130 may be coupled to certain planes 11-14, 21-23 within another set of planes 11-14, 21-23.

In one embodiment, ground balls within row 69 may be coupled to ground plane 13 however, by virtue of the deletion of vias 133 between ground plane 13 and ground plane 12, ground balls in row 69 are no longer coupled to other ground planes 12, 11 of package 100. Similarly, power balls in row 67 may be coupled to power planes 22 and 21 but by virtue of the deletion of vias 134 between power plane 22 and power plane 21, power balls in row 67 are no longer coupled to the remaining power planes 21 in package 100. For ease of illustration FIG. 9B has been drawn to show a cross section of the ground balls in row 69 and the power balls in row 67, however, it will be appreciated that these same structures may be applied for entire rows 61-69 of BGA balls 130. For example, ground balls and power balls in row 69, distal from power supply 210 and proximate to die 110 may each be coupled to only one ground plane and power plane respectively, reducing current crowding in row 69.

Figure 10A:
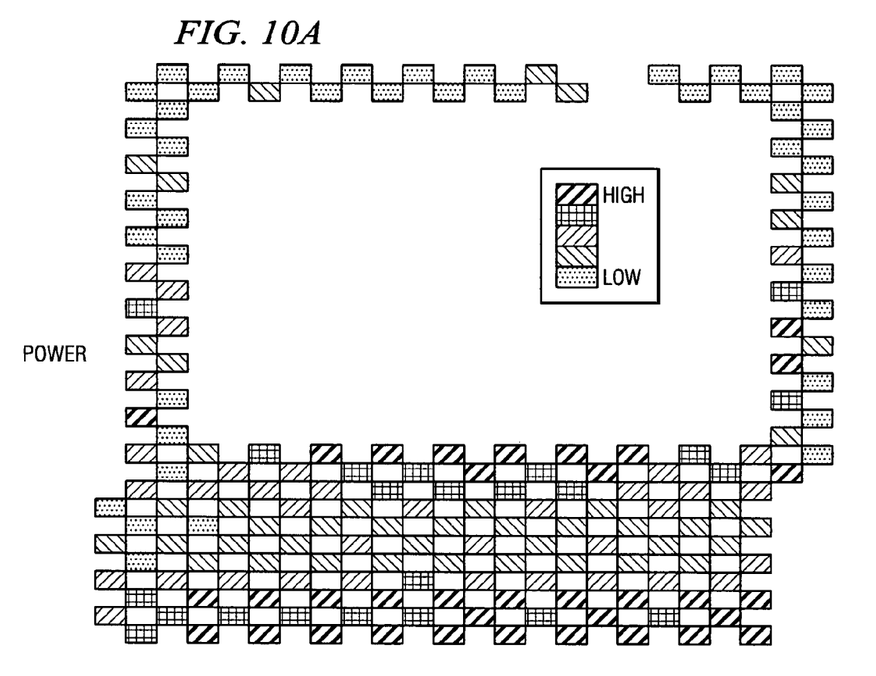
FIGS. 10A and 10B depicts a representation of the current flowing through the BGA balls of a semiconductor package constructed similarly to the one depicted in FIG. 9B.
Figure 10B:
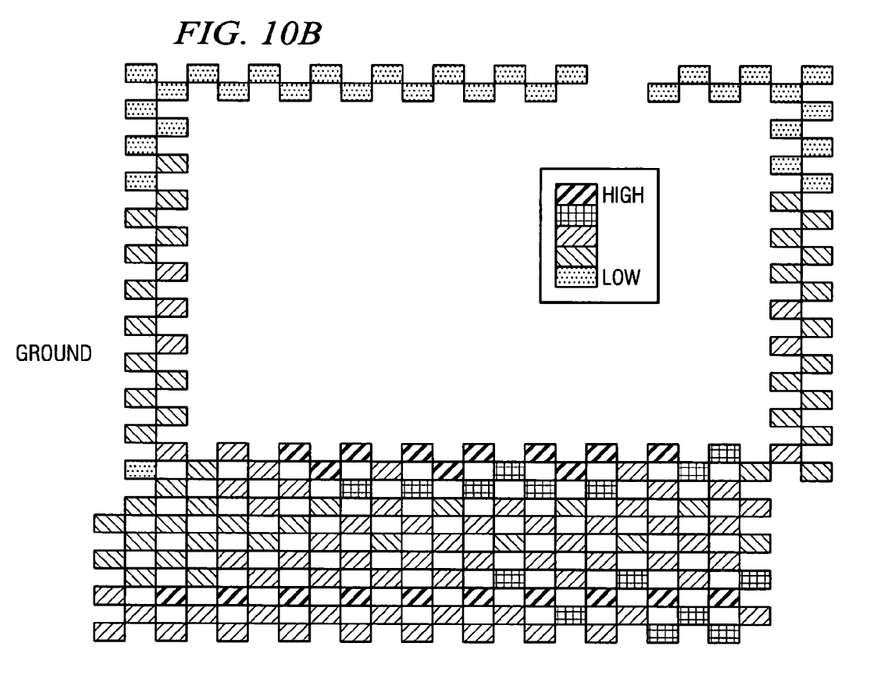

FIGS. 10A and 10B depict the improved power distribution characteristics which may be achieved with the structure for a power distribution network depicted in FIG. 9B. FIGS. 10A and 10B depict the current flowing through BGA balls 130 in a power distribution network like that depicted in FIG. 9B from the point of view of a ground plane 21-23 of package 100 and a power plane 11-14 of package 100. Yet again, supposing a 100 ampere power supply, the maximum current flowing through a power plane is 1.5A, while the maximum current flowing through a ground plane is 1.4A. Note that the maximum current flowing through any one ball of BGA is 1.5 amperes, which occurs in a BGA ball 130 in the row of BGA balls distal from power supply 210 and proximate to die 110.

As can be seen, the systems and methods of the present invention described above present structures which improve the power distribution characteristics of a power distribution network by increasing the impedance of the package through which power is being distributed. In many cases, this is accomplished by restricting the path through which current must travel utilizing embodiments of the systems and methods expounded above. However, the opposite tack may be taken as well. To improve the power distribution characteristics of a power distribution network the design of the PCB 220 to which package 100 is coupled may be improved, in many cases to achieve a lower impedance.

Figure 11A:
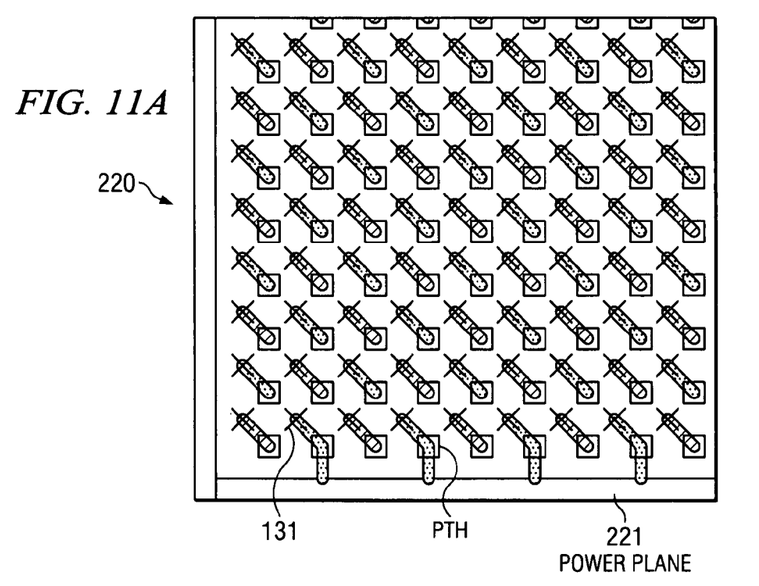
FIG. 11A depicts a representation of a structure for a power distribution network.
Figure 11B:
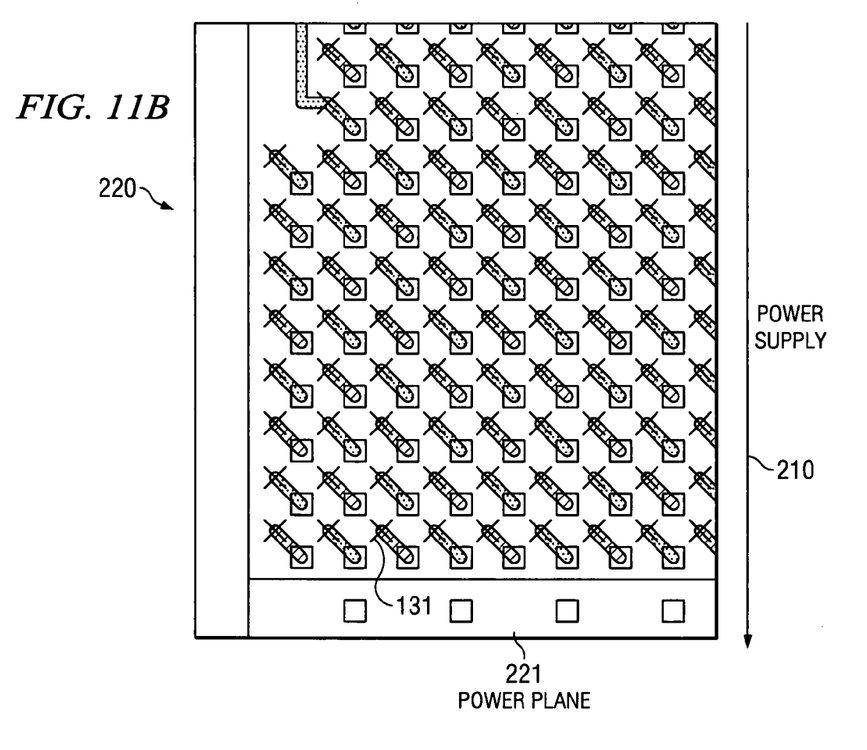
FIG. 11B depicts a representation of one embodiment of a structure for a power distribution network in accordance with the systems and methods of the present invention.

These improvements are depicted in FIGS. 11A and 11B. PCB 220 may have an area where BGA balls 130 of package 100 attach to PCB 220. For most of these attachment points 131, current flows from the planes of PCB 220 through PTHs to balls 130 of BGA of package 100. However, it is typically the case that at least one layer of PCB 220 is directly and physically coupled to the row of attachment points 131 proximate power supply 210. For example, attachment points 131 for power balls proximate to power supply 210 may be directly attached to power plane 221 in PCB 220 on the top layer of PCB 220, as shown in FIG. 11A. This structure results in the impedance between power plane 221 and BGA balls 130 coupled to attachment points 131 being smaller that between power plane 221 and other BGA balls 130.

By eliminating one or more of these direct physical connections, improved power distribution characteristics may be obtained for the power distribution network by equalizing the impedance across all BGA balls 130. One embodiment for a structure for a PCB 220 of this type is depicted in FIG. 11B.

In this embodiment, there are no direct physical connections between power plane 221 of PCB 220 and BGA attachment points 131 for power balls on PCB 220. Additionally, in some embodiments, to further decrease impedance of PCB 220 additional plate through holes may be added to portions of PCB 220 near attachment points 131.

Figure 12A:
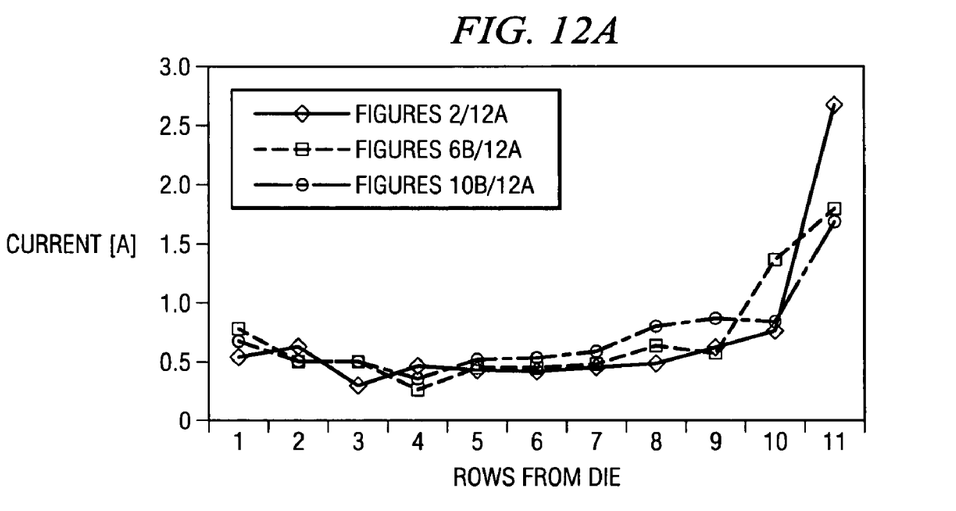
FIGS. 12A and 12B depict a comparison of power distribution networks constructed in accordance with embodiments of the present invention.
Figure 12B:
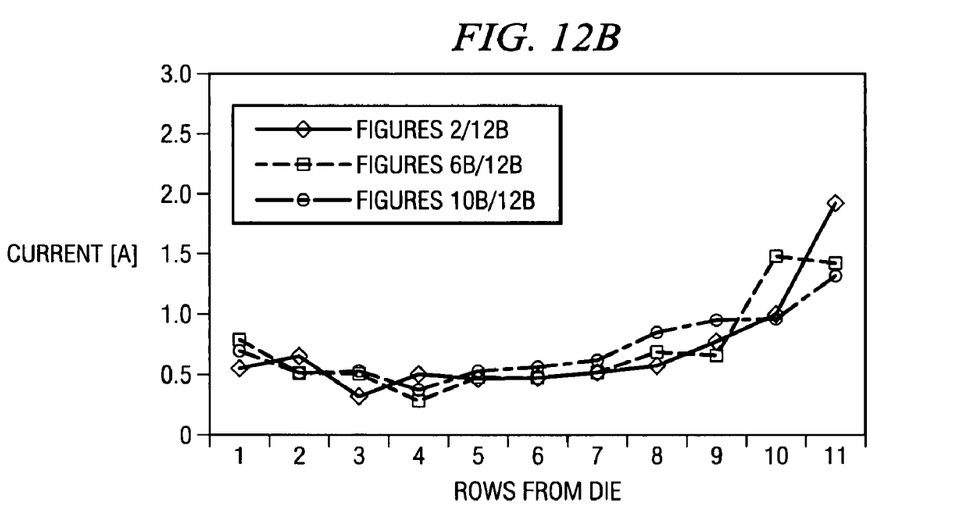

For comparison sake, FIGS. 12A and 12B depict a comparison between the current flowing through BGA balls 130 in three power distribution network using PCB 220 like that depicted in FIG. 11A versus the current flowing through BGA balls 130 in three power distribution networks using PCB 220 like that depicted in FIG. 11B and a 100 ampere power supply. FIG. 12A depicts current flow through embodiments of the three package structures depicted in FIGS. 2, 5 and 9 utilized in conjunction with the PCB structure depicted in FIG. 11A, while FIG. 12B shows the current flow through these same package structures utilized in conjunction with the PCB structure depicted in FIG. 11B. Notice that the maximum current flowing through any BGA ball 130 in FIG. 12B is 1.8 amperes. Additionally, notice that the relative distribution of current throughout BGA balls 130 comprising the power distribution network depicted in FIG. 11B is more even. For example, compare FIG. 12A to FIG. 12B. Utilizing PCB 220 depicted in FIG. 11B, current is less concentrated in the balls 130 of BGA located proximate power supply 210, and is more evenly distributed throughout the other three sides than the power distribution network utilizing PCB 220 depicted in FIG. 11A.

It will be apparent to those of skill in the art after reading this disclosure that traditional manufacturing processes may be utilized to achieve the power distribution network disclosed herein. Including using masks, photomasks, x-ray masks, mechanical masks, oxidation masks, lithography etc to form the structures described with respect to the systems and methods of the present invention. It will also be apparent that the systems and methods disclosed for improving power distribution characteristics through increasing the impedance of a package, and the systems and methods for accomplishing these improved power distribution characteristics through reducing the impedance of a PCB may be used in conjunction for greater effect.

Furthermore, the combinations and embodiments of the systems and methods presented may be utilized to improve the power distribution network no matter the type of package or power distribution network is used. For example, in packages where two or more sides of a BGA of a package are utilized for a power distribution network.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A power distribution network in a semiconductor device package, comprising:
   a set of rows of ball grid array (BGA) balls; and
   a set of planes comprising alternating planes from a set of ground planes and a set of power planes, wherein
     at least one BGA ball from at least one row of BGA balls is coupled to at least one of the planes,
     at least one row of BGA balls includes one of a set of power balls and a set of ground balls,
     a first plane and a second plane adjacent to the first plane are not coupled to a first BGA ball located at an edge of the semiconductor device package proximate to a power supply,
     a third plane or a fourth plane adjacent to the third plane which are located far above the first and second planes is coupled to the first BGA ball,
     the first BGA ball is in a first row of BGA balls located at an edge of the semiconductor device package proximate to the power supply and coupled to the third and fourth planes,
     the first and second planes are not coupled to the first row of BGA balls,
     a second row of BGA balls is proximate the first row of BGA balls,
     the first plane and the second plane are not coupled to the second row of BGA balls,
     the third and fourth planes are coupled to the second row of BGA balls, and
     the first plane and the third plane are power planes and the second plane and the fourth plane are ground planes.

2. The system of claim 1, comprising:
   a second BGA ball proximate a die, wherein the third plane and the fourth plane are not coupled to the second BGA ball.

3. The system of claim 2, wherein the second BGA ball is in a third row of BGA balls and the third plane and the fourth plane are not coupled to the third row of BGA balls.

4. The system of claim 3, comprising a fourth row, wherein the third plane and fourth plane are not coupled to the fourth row of BGA balls.

5. The system of claim 4, further comprising: a printed circuit board, including:
   a set of attachment points, each attachment point operable to couple one of the BGA balls of the semiconductor package to the printed circuit board, including a first attachment point proximate the power supply; and
   a set of layers, wherein there is no direct physical connection between the layers and the first attachment point.

6. The system of claim 5, comprising a first row of attachment points proximate the power supply, wherein the first attachment point is in the first row of attachment points.

7. The system of claim 6, wherein there is no direct physical connection between the first row of attachment points and the set of layers.

8. A system for a power distribution network in a semiconductor device package, comprising:
   a set of rows of ball grid array (BGA) balls: and
   a set of planes comprising alternating planes from a set of ground planes and a set of power planes, wherein
     at least one BGA ball from at least one row of BGA balls is coupled to at least one of the planes,
     said at least one row of BGA balls includes one of a set of power balls and a set of ground balls,
     a first plane and a second plane adjacent to the first plane are not coupled to a first BGA ball proximate a die,
     a third plane or a fourth plane adjacent to the third plane which are located far below the first and second planes is coupled to the first BGA ball;
     the first BGA ball is in a first row of BGA balls, the first plane and second plane are not coupled to the
first row of BGA balls,
the first row of BGA balls is proximate the die and
coupled to the third and fourth plane
a second row of BGA balls is proximate the first row of
BGA balls and is not coupled to the first plane and the
second plane,
the third and fourth planes are coupled to the second row
of BGA balls, and
the first plane and the third plane are power planes and
the second plane and the fourth plane are ground
planes.

9. The system of claim 8, comprising:
a second BGA ball, located at an edge of the semiconductor
device package proximate to a power supply, wherein
the third plane and the fourth plane is are not coupled to
the second BGA ball.

10. The system of claim 9, wherein the second BGA ball is
in a third row of BGA balls, the third plane and the fourth
plane are not coupled to the third row of BGA balls, and the
third plane and the fourth plane are proximate the BGA balls.

11. The system of claim 10, comprising a fourth row of
BGA balls, wherein the third plane and fourth plane are not
coupled to the fourth row of BGA balls and the fourth plane is
proximate the third plane.

12. The system of claim 11, further comprising:
a printed circuit board, including:
    a set of attachment points, each attachment point operable to couple one of the BGA balls of the semiconductor package to the printed circuit board, including a first attachment point proximate the power supply; and
    a set of layers, wherein there is no direct physical connection between the layers and the first attachment point.

13. The system of claim 12, comprising a first row of
attachment points proximate the power supply, wherein the
first attachment point is in the first row of attachment points.

14. The system of claim 13, wherein there is no direct
physical connection between the first row of attachment
points and the set of layers.

15. A method for a power distribution network in a semiconductor device package, comprising:
forming a set of rows of ball grid array (BGA) balls: and
forming a set of planes comprising alternating planes from
    a set of ground planes and a set of power planes, wherein
    at least one BGA ball from at least one row of BGA balls
        is coupled to at least one of the planes,
    at least one row of BGA balls includes one of a set of
        power balls and a set of ground balls,
    a first plane and a second plane adjacent to the first plane
        are not coupled to a first BGA ball located at an edge
        of the semiconductor device package proximate to a
        power supply,
    a third plane or a fourth plane adjacent to the third plane
        which are located far above the first and second planes
        is coupled to the first BGA ball,
    the first BGA ball is in a first row of BGA balls located
        at an edge of the semiconductor device package proximate to the power supply and coupled to the third and
        fourth planes,
    the first and second lanes are not coupled to the first row
        of BGA balls,
    a second row of BGA balls is formed proximate the first
        row of BGA balls,
    the first plane and the second plane are not coupled to the
        second row of BGA balls,
    the third and fourth planes are coupled to the second row
        of BGA balls, and
    the first plane and the third plane are power planes and
        the second plane and the fourth plane are ground
        planes.

16. The method of claim 15, comprising:
forming a second BGA ball, proximate a die, wherein the
    third plane and the fourth plane are not coupled to the
    second BGA ball.

17. The method of claim 16, wherein the second BGA ball
is formed in a third row of BGA balls and the third plane and
the fourth plane are not coupled to the third row of BGA balls.

18. The method of claim 17, comprising forming a fourth
row of BGA balls, wherein the third plane and fourth plane
are not coupled to the fourth row of BGA balls.

19. The method of claim 18, further comprising:
forming a printed circuit board, including:
    forming a set of attachment points, each attachment
        point operable to couple one of the set of BGA balls of
        the semiconductor package to the printed circuit
        board, including a first attachment point proximate
        the power supply; and
    forming a set of layers, wherein there is no direct physical connection between the layers and the first attachment point.

20. The method of claim 19, wherein a first row of attachment points is formed proximate the power supply, wherein
the first attachment point is in the first row of attachment
points.

21. A method for a power distribution network in a semiconductor package comprising:
forming a set of rows of ball grid array (BGM) balls; and
forming a set of planes as alternating planes from a set of
    round planes and a set of power planes, wherein
    at least one BGA ball from at least one row of BGA balls
        is coupled to at least one of the planes,
    said at least one row of BGA balls includes one of a set
        of power balls and a set of ground balls,
    a first plane and a second plane adjacent to the first plane
        are not coupled to a first BGA ball proximate a die,
    the first BGA ball is in a first row of BGA balls proximate the die,
    the first plane and second plane are not coupled to the
        first row of BGA balls
    a third plane or a fourth plane adjacent to the third plane
        which are located far below the first and second planes
        is coupled to the first BGA ball
    the first row of BGA balls is coupled to the third and
        fourth planes,
    the first plane and the second plane are not coupled to a
        second row of BGA balls and the third and fourth
        planes are coupled to the second row of BGA balls,
        and
    the first plane and the third plane are power planes and
        the second plane and the fourth plane are ground
        planes.

22. The method of claim 21, comprising:
forming a second BGA ball, located at an edge of the
    semiconductor device package proximate to a power
    supply, wherein the third plane and the fourth plane are
    not coupled to the second BGA ball.

23. The method of claim 22, wherein the second BGA ball
is in a third row of BGA balls, the third plane and the fourth
plane are not coupled to the third row of BGA balls, and the
third plane and fourth plane are proximate the BGA balls in
the set of BGA balls.

24. The method of claim 23, comprising forming a fourth row, wherein the third plane and fourth plane are not coupled to the fourth row of BGA balls and the fourth plane is proximate the third plane.

25. The method of claim 24, further comprising:
forming a printed circuit board, including:
   forming a set of attachment points, each attachment point operable to couple one of the set of BGA balls of the semiconductor package to the printed circuit board, including a first attachment point proximate the power supply; and
   a set of layers, wherein there is no direct physical connection between the layers and the first attachment point.

26. The method of claim 25, wherein the printed circuit board comprises a first row of attachment points proximate the power supply, wherein the first attachment point is in the first row of attachment points.

27. The method of claim 26, wherein no direct physical connection is formed between the first row of attachment points and the set of layers.

* * * * *